(12) United States Patent
Gundogan et al.

(10) Patent No.: US 6,826,057 B1
(45) Date of Patent: Nov. 30, 2004

(54) ELECTRONIC CABINET PANEL WITH IMPROVED LATCHING MECHANISM

(75) Inventors: C. Ilhan Gundogan, Lexington, MA (US); Gerald J. Cote, Westborough, MA (US); Albert F. Beinor, Jr., Sutton, MA (US); Joseph P. King, Jr., Sterling, MA (US); Joseph P. DeYesso, Walpole, MA (US); W. Brian Cunningham, Westborough, MA (US); Joseph Louis Brigham, Jr., North Attleborough, MA (US)

(73) Assignee: EMC Corporation, Hopkinton, MA (US)

( * ) Notice: Subject to any disclaimer, the term of this patent is extended or adjusted under 35 U.S.C. 154(b) by 24 days.

(21) Appl. No.: 10/253,255

(22) Filed: Sep. 24, 2002

(51) Int. Cl.[7] .................................................. H05K 5/03
(52) U.S. Cl. ...................................... 361/726; 361/724
(58) Field of Search .................................. 361/724–727

(56) References Cited

U.S. PATENT DOCUMENTS

| | | | |
|---|---|---|---|
| 5,349,132 A | * | 9/1994 | Miller et al. .............. 174/35 R |
| 5,388,032 A | * | 2/1995 | Gill et al. ..................... 700/17 |
| D421,431 S | | 3/2000 | Mazzetti et al. ........... D14/115 |
| D421,977 S | | 3/2000 | Wong ........................ D14/115 |
| D447,485 S | | 9/2001 | Carbonneau et al. ...... D14/445 |
| 6,297,948 B1 | * | 10/2001 | Buican et al. .............. 361/683 |
| D454,881 S | | 3/2002 | Daniels et al. ............. D14/446 |
| D455,754 S | | 4/2002 | Gant et al. ................. D14/446 |
| 6,477,055 B1 | * | 11/2002 | Bolognia et al. ........... 361/724 |

* cited by examiner

Primary Examiner—Yean-Hsi Chang
(74) Attorney, Agent, or Firm—Chapin & Huang, L.L.C.; David E. Huang, Esq.

(57) ABSTRACT

An electronic cabinet having a set of vertically-oriented frame members, a set of fasteners attached to the set of vertically-oriented frame members, and a panel. The panel includes a cover, a set of latches coupled to the cover, and a set of buttons. When the set of latches engages the set of fasteners to secure the panel to the set of vertically-oriented frame members and when the set of buttons is depressed, the set of buttons disengages the set of latches from the set of fasteners to release the panel from the set of vertically-oriented frame members. Such a configuration enables a user to fully remove the panel from the cabinet without having to disconnect a hinge as for conventional hinged panels. Furthermore, such a configuration is well-suited for employing a locking mechanism that controls depression of the set of buttons to provide secure equipment access.

30 Claims, 9 Drawing Sheets

ELECTRONIC CABINET PANEL WITH IMPROVED LATCHING MECHANISM

BACKGROUND OF THE INVENTION

A typical equipment rack is a rigid frame-like structure for supporting an assortment of electronic equipment. Such a rack is suitable for supporting components of various electronic systems such as a general purpose computer system, a data storage system, network equipment, test equipment, power supply equipment, as well as other types of equipment.

The front of such a rack typically includes a pair of parallel vertical rails to which the electronic equipment is mounted. Some equipment rack manufacturers and electronic equipment manufacturers provide front panels which fasten to the front of the equipment rack in order to cover the electronic equipment housed therein. In particular, such panels tend to provide a more aesthetically pleasing look to the equipment rack, as well as provide protection to the equipment housed within the equipment rack (e.g., discourages tampering, prevents external objects or bystanders from inadvertently contacting the equipment housed within the rack, etc.). Some panels are equipped with vents that enable air circulation, holes which enable a user to read information from output devices (e.g., LEDs, display screens, etc.), holes which enable the user to operate the equipment (e.g., buttons, dials, etc.), and emblems displaying one or more manufacturer trademarks, among other things.

One conventional equipment rack includes a left-hand fastener which fastens to a left-hand vertical rail at the front of the rack, and a right-hand fastener which fastens to a right-hand vertical rail at the front of the rack. The equipment rack further includes a panel having (i) a left-hand protruding side which extends perpendicularly from the left edge of the panel, and (ii) a right-hand protruding side which extends perpendicularly from the right edge of the panel. To attach the panel to the rack, a user first installs the left-hand and right-hand fasteners onto the rack (e.g., using hardware). Next, the user aligns the panel with the rack such that the left-hand protruding side of the panel is adjacent the left-hand fastener, and such that the right-hand protruding side of the panel is adjacent the right-hand fastener. The user then moves the panel toward the rack such that the protruding sides snap onto the corresponding fasteners thus holding the panel to the rack. To remove the panel, the user simply pushes the protruding sides of the panel toward each other, thus unlatching the sides from the fasteners and allowing complete removal of the panel from the rack.

Another conventional equipment rack employs a lockable hinged panel. Here, the rack includes a panel which has a hinge along its bottom edge, and a lock disposed along its top edge near the midpoint of the top edge. A user can selectively set the lock to either a locked state or an unlocked state using a key. To install the panel, the user first installs the hinge of the panel to the vertical rails of the equipment rack. In some situations, the user installs the hinge to the chassis of the equipment mounted to the equipment rack rather than directly to the rack itself. The panel is now hinged to the rack and can pivot about the hinge in a door-like manner. Next, the user rotates the panel upward and toward the rack about the hinge until a tab, which is controlled by the lock, latches the top edge of the panel to the equipment chassis or to a horizontal rail of the rack. At this point, the panel is fully installed onto the rack and, among other things, provides more secure access to the equipment, e.g., a user can lock the panel using a key thus preventing someone without the key from opening the panel from its closed position and tampering with the equipment. To open the panel, the user turns the lock to the unlocked state using the key, and pulls down on a small tab at the top edge of the panel. The small tab is free to move and disengage the top edge of the panel from the rack once the lock enters the unlocked state. Although the hinged edge of the panel remains fastened to the rack, the panel is now free to rotate downward and outward about the hinge to provide the user with access to the equipment.

SUMMARY OF THE INVENTION

Unfortunately, there are deficiencies to the above-described conventional equipment rack panels. For example, in connection with the conventional panel that has left-hand and right-hand protruding sides that latch to fasteners on the vertical rails of the equipment rack, the panel tends not to fasten very well to the equipment rack. In particular, the protruding sides of the panel can pop out over time (e.g., due to inadvertent contact with an external object or user, due to vibration cause by one or more fan assemblies mounted within the rack or nearby, etc.) thus causing the panel to inadvertently fall off the equipment rack. Furthermore, the panel has no locking mechanism (i.e., the panel simply snaps on and off) thus leaving the equipment housed within the rack vulnerable to tampering and/or theft.

Additionally, in connection with the above-described lockable hinged panel, the panel requires a hinge which connects the panel to the equipment rack in a relatively permanent manner. That is, a user can gain or prevent access to the equipment by opening and closing the panel in a door-like manner but, if for some reason the user must remove the panel completely, the user must disconnect the hinge from the rack. Such a task can, in some situations, be relatively complex and require manipulation of many separate parts thus risking losing the parts and/or risking improper reassembly.

In contrast to the above-described conventional panels, the invention is directed to panel attachment and detachment techniques which use a panel having a set of latches and a set of buttons. When the set of latches attaches the panel to a frame (e.g., an equipment rack), a user is capable of actuating the set of latches to disengage the panel from the frame by depressing the set of buttons (e.g., by pushing a first button and a second button disposed in a front face of the panel toward each other).

One embodiment of the invention is directed to an electronic cabinet (e.g., an equipment rack) having a set of vertically-oriented frame members (e.g., vertical rails), a set of fasteners attached to the set of vertically-oriented frame members, and a panel. The panel includes a cover, a set of latches coupled to the cover, and a set of buttons. When the set of latches engages the set of fasteners to secure the panel to the set of vertically-oriented frame members and when the set of buttons is depressed, the set of buttons disengages the set of latches from the set of fasteners to release the panel from the set of vertically-oriented frame members. Such a configuration enables a user to fully remove the panel from the cabinet without having to disconnect a hinge as in the above-described conventional hinged panel. Furthermore, such a configuration is well-suited for employing a locking mechanism that selectively enables or disables depression of the set of buttons to provide more secure equipment access.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to panel attachment and detachment techniques which use a panel having a set of latches and a set of buttons. When the set of latches attaches the panel to a frame (e.g., an equipment rack), a user is capable of actuating the set of latches to disengage the panel from the frame by depressing the set of buttons (e.g., by pushing a first button and a second button disposed in a front face of the panel toward each other).

Figure 1:
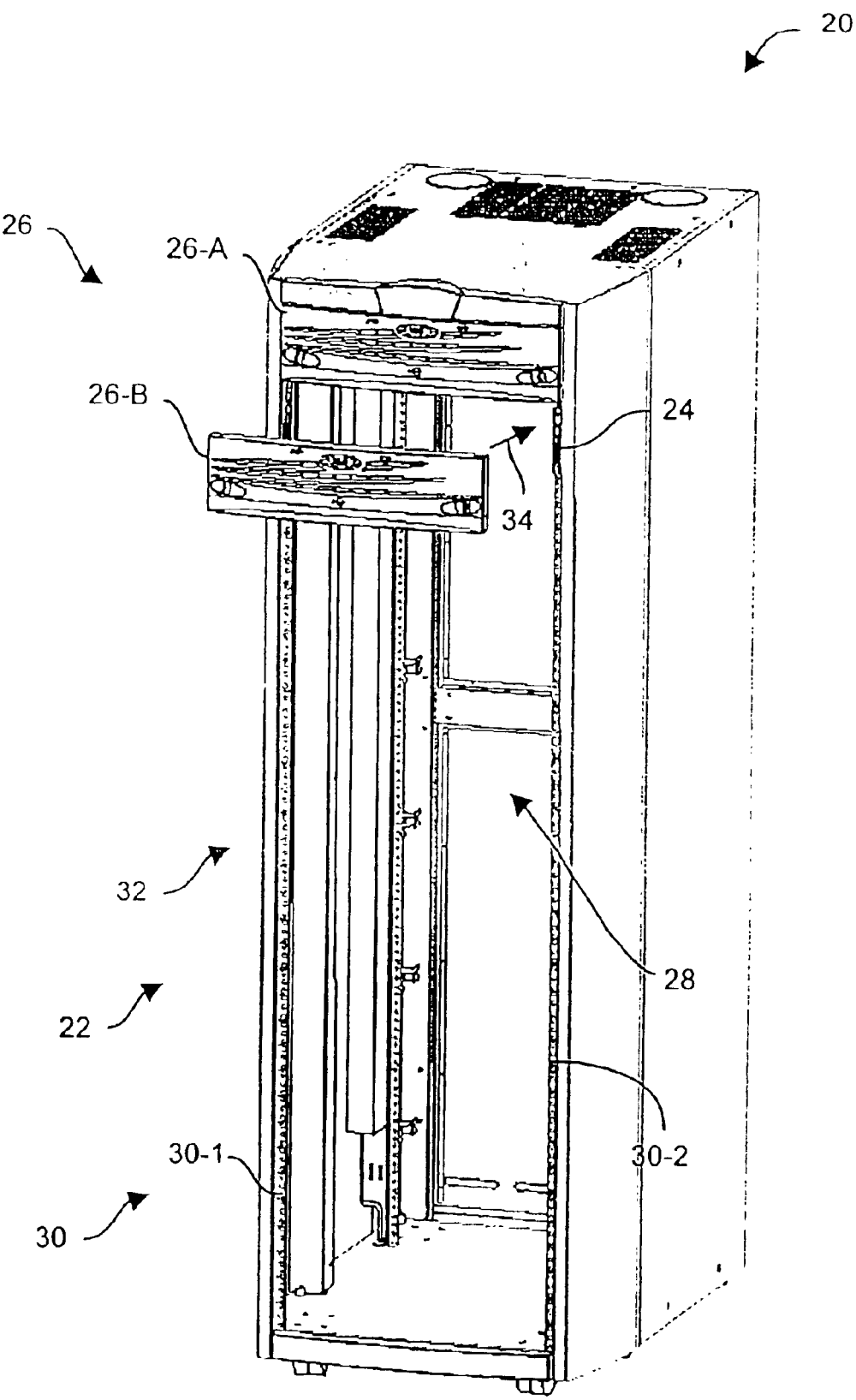
FIG. 1 is a perspective view of an electronic cabinet which is suitable for use by the invention.

FIG. 1 shows an electronic cabinet 20 which is suitable for use by the invention. The electronic cabinet 20 includes, among other things, an electronic cabinet frame 22, a set of fasteners 24 and a set of front panels 26. The electronic cabinet frame 22 includes an assembly of frame members 28 (e.g., metal rails which are bolted and/or welded together to form the rigid structure of the electronic cabinet 20). Among the frame members 28 is a set of vertically-oriented frame members 30-1, 30-2 (collectively, vertically-oriented frame members 30). The fasteners 24 are configured to attach to the vertically-oriented frame members 30 (e.g., to attach over an equipment chassis mounted directly to the vertically-oriented frame members 30, or alternatively to other frame members 28), and the panels 26 are configured to subsequently attach to the fasteners 24.

By way of example only, FIG. 1 shows a first panel 26-A attached to the front 32 of the electronic cabinet frame 22, and a second panel 26-B which is aligned with the front 32 of the electronic cabinet frame 22 but not yet attached to the electronic cabinet frame 22. As will be explained in further detail shortly, a user can simply push the second panel 26B toward the electronic cabinet frame 22 in the direction 34 to install the second panel 26-B onto the electronic cabinet frame 22.

It should be understood that the fasteners 24 define catch portions which allow the panel 26 to latch to and de-latch from the electronic cabinet frame 22. In one arrangement, the fasteners 24 attach to the electronic cabinet frame 22 using hardware (e.g., screws which extend through holes in the fasteners 24, then through holes in an equipment chassis and then through the frame members 30). In another arrangement, the fasteners 24 simply mount onto the frame 22 without any need for hardware. A suitable fastener which attaches to a frame without the need for any hardware is described in U.S. patent application Ser. No. 10/215,573, entitled "Techniques for Fastening a Panel to An Electronic Cabinet Frame", filed Aug. 9, 2002, the teachings of which are hereby incorporated by reference in their entirety: Further details of the invention will now be provided with reference to FIG. 2.

Figure 2:
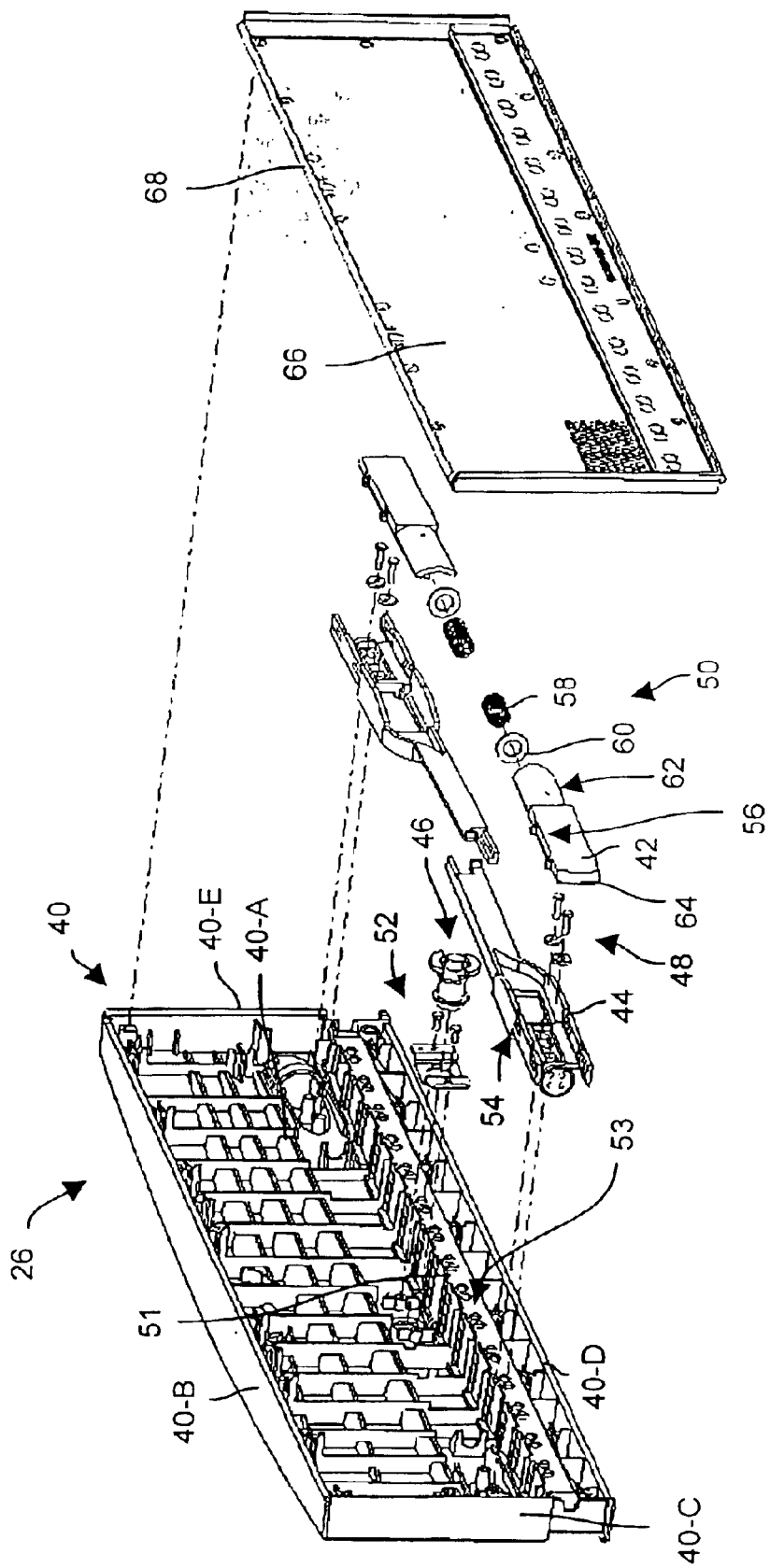
FIG. 2 is an exploded view of a panel of the electronic cabinet of FIG. 1, the view showing a hack side of the panel.

FIG. 2 is an exploded view of a panel 26. The viewing angle is generally from the back side of the panel 26 (i.e., slightly offset from the perspective of the electronic cabinet frame 22, also see FIG. 1). As shown, the panel 26 includes a cover 40, a set of latch members 42 (hereinafter simply latches 42), a set of button members 44 (hereinafter simply buttons 44) and a locking device 46.

As further shown in FIG. 2, the panel 26 further includes hardware 48 (e.g., a set of screws and non-metallic washers) for holding each button 44 to the cover 40, hardware 50 (e.g., a spring and a washer) for biasing each latch 42 relative a tab 51 defined by the cover 40, and hardware 52 (e.g., a plate and screws) for holding the locking device 46 to the cover 40. The cover 40 includes a central portion 40-A, and side portions 40-B, 40-C, 40-D and 40-E. The side portions 40-B, 40-C, 40-D and 40-E are disposed around a periphery of the central portion 40-A and extend from the central portion 40-A in a substantially perpendicular manner. The central portion 40-A further defines respective channels 53 within which fits a corresponding button 44 and a corresponding latch 42.

By way of example only and in connection with each side 40-C, 40-E of the panel 26, the button 44 defines a set of grooves 54, and the latch 42 defines a set of tabs 56 which corresponds to the set of grooves 54 defined by the button 44. Accordingly, a user can attach the latch 42 to the button 44 by loading the hardware 50 onto the latch 42 and then engaging the tabs 56 of the latch 42 with the grooves 54 of the button 44. At this point, the latch 42 is affixed to the button 44 and is capable of being actuated by the button 44.

In one arrangement, the hardware 50 includes a spring 58 and a washer 60. The user installs the latch 42 onto the button 44 by first loading the spring 58 and the washer 60 onto a dowel-shaped extension of the latch 42, compressing the spring 58 and the washer 60 and holding the spring 58 and the washer 60 together in the compressed state sing a pin that inserts through a hole 62 in the latch 42. The pin interferes with the compressed spring 58 and the washer 60 and thus hold the spring 58 and the washer 60 in a compressed state. The user then engages the latch 42 with the button 44 (i.e., the user slides the set of latch tabs 56 into the set of button grooves 54). Next, the user removes the pin from the hole 62 which allows the spring 58 and the washer 60 to at least partially decompress between the latch 42 and the tab 51 defined by the cover 40. The decompressed spring 58 biases the latch 42 and the button 44 against the cover tab 51.

It should be understood that the spring 58 biases both the latch 42 and the button 44 into a normal operating position. In particular, such spring biasing pushes the latch 42 and the button 44 toward the edge of the cover 40 (e.g., a side 40-C or 40-E) such that a button face of the button 44 extends through the cover 40. Accordingly, when the locking device 46 is in the unlocked state, the latch 42 and the button 44 are biased away from the locking device 46 but are depressible. That is, if the user applies enough force to the button face of the button 44 to overcome the spring biasing force, the button 44 moves toward the locking device 46 and away from the edge of the cover 40. The button 44 moves the latch 42 with the button 44 such that the latch 42 also moves toward the locking device 46 and away form the edge of the cover 40. When the user releases the button 44, the spring 58 biases both the latch 42 and the button 44 back to the edge of the cover 40 (i.e., back to the sides 40-C, 40-E).

It should be understood that the latches 42 are capable of moving even when the locking device 46 is in the locked state. In particular, each latch 42 defines a latch end 64 which is configured to engage and disengage with a fastener 24 attached to the electronic cabinet frame 22. As will be explained in further detail later, the capability of the latches 42 to move even when the locking device 46 prevents the buttons 44 from moving enables the panel 26 to latch with the electronic cabinet frame 22 at any time e.g., even when the locking device 46 is in the locked state) and prevents the latches 42 from sustaining damage (e.g., the latch 42 cannot inadvertently jam).

In one arrangement, the panel 26 further includes an electromagnetic interference (EMI) shield 66 having an EMI gasket 68. The EMC shield 66 prevents EMI radiation from passing through the panel 26 (i.e., exiting and/or entering) between the electronic cabinet 20 and the external surroundings. The EMI gasket 68 is a compressible liner along the periphery of the EMI shield 66. The EMI gasket 68 slightly pushes the panel 26 away from the electronic cabinet frame 22 after the panel 26 has been installed onto the frame 22. Accordingly, a user handling the panel 26 feels that the panel 26 is tightly sealed against the frame 22 when the panel 26 is fastened to the frame 22. Furthermore, the compression of the EMI gasket 68 tends to dampen vibration between the panel cover 40 and the frame 22 thus reducing the likelihood of rattling between the panel cover 40 and the frame 22. Further details of the invention will now be provided with reference to FIG. 3.

Figure 3:
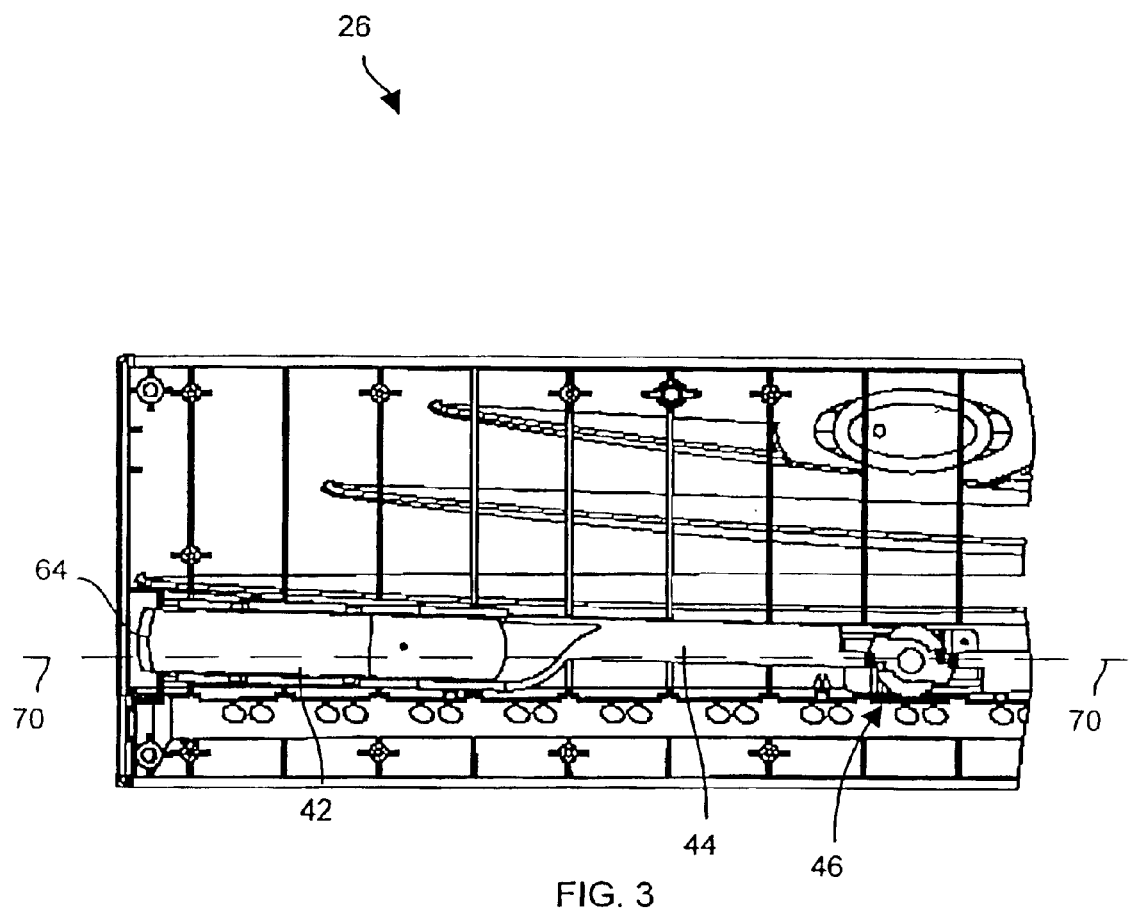
FIG. 3 is an assembled view of a portion of the panel of FIG. 2, the view showing the back side of the panel.

FIG. 3 shows a portion of the panel 26 of FIG. 2 in an assembled state from the back side. That is, FIG. 3 shows the panel 26 when a latch 42, a button 44 and the locking device 46 are fully installed onto the cover 40. Both the button 44 and the latch 42 reside within the channel 53 defined by the cover 40. At this point, both the button 44 and the latch 42 are capable of lateral movement along an axis 70 defined by the button 44 and the latch 42. The button 44 and latch 42 on the side opposite the locking device 46 (i.e., adjacent the side 40-E in FIG. 2) operate in a similar manner. These features of the invention will be discussed in further detail later when the operation of the panel is discussed further.

Figure 4:
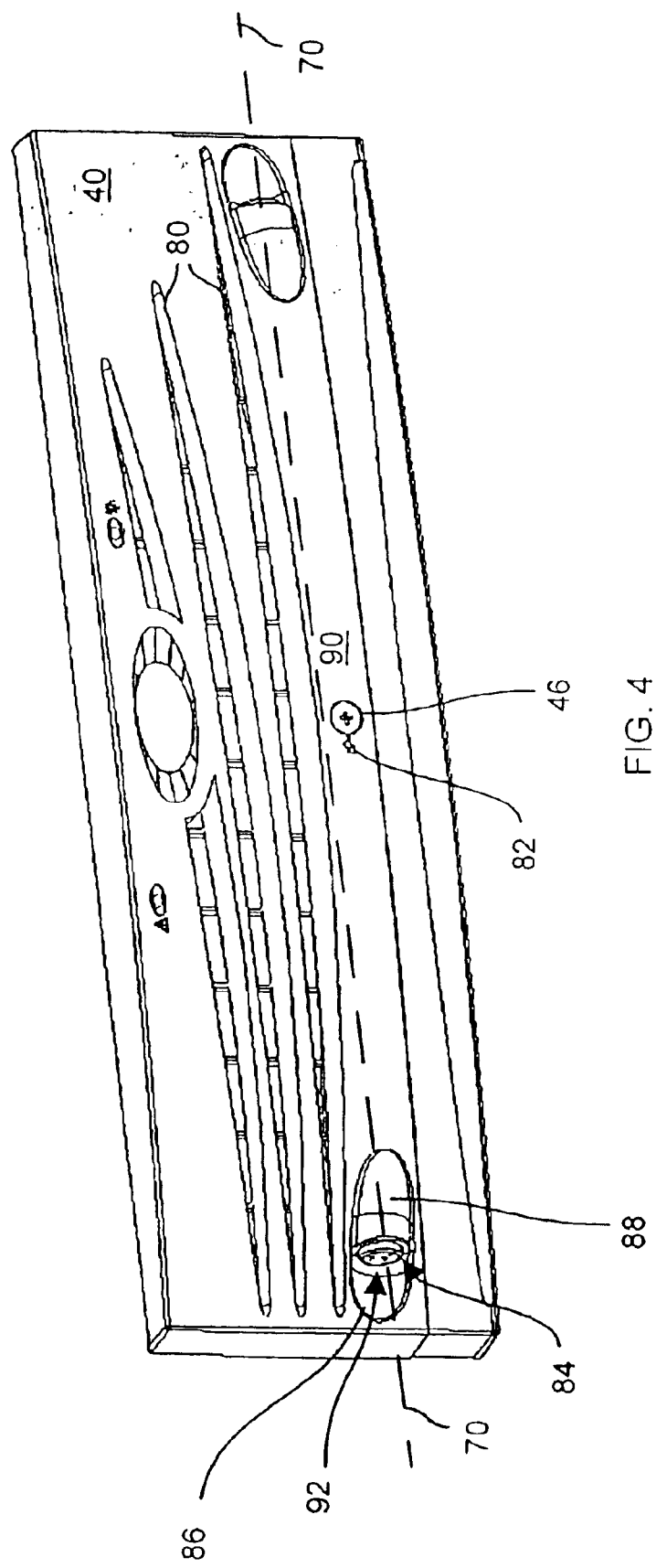
FIG. 4 is a front view of the panel of FIG. 2.
Figure 4A:
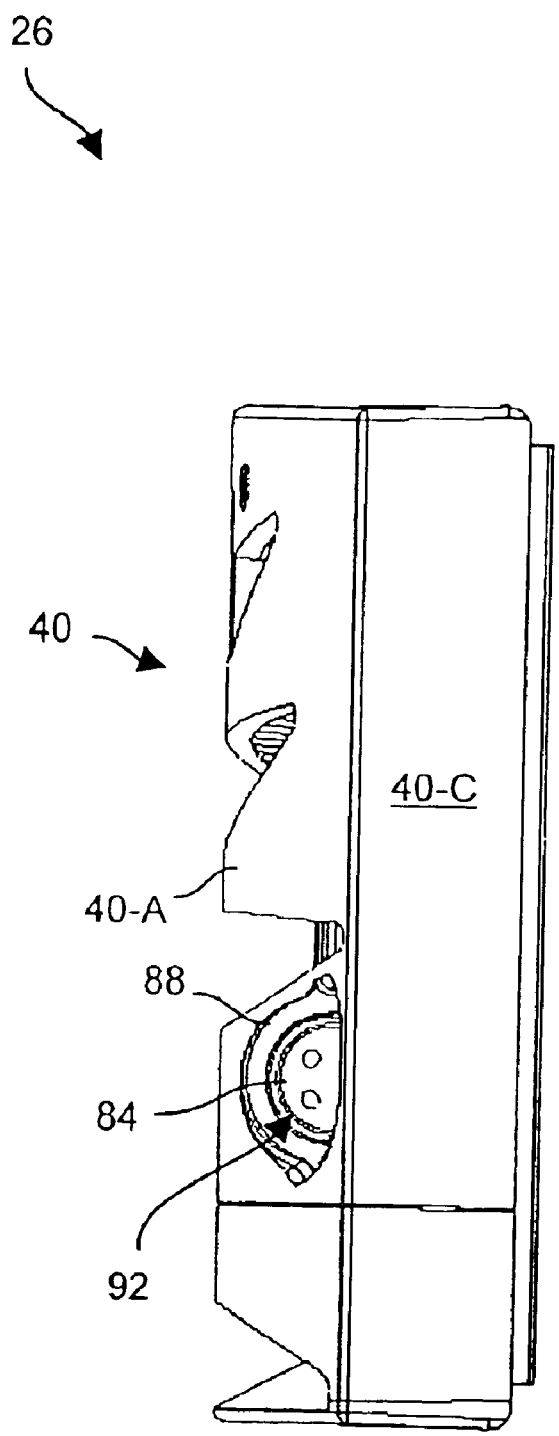
FIG. 4A is a side view of the panel of FIG. 2.

FIG. 4 shows the panel 26 of FIG. 2 generally from the front side. As shown, the cover 40 of the panel 26 defines a set of vents 80 (e.g., simple openings, louvers, etc.) which permit air flow between the front side and the back side of the panel 26 (e.g., for heat removal when equipment is installed within the electronic cabinet 20 and when the equipment is operating). The cover 40 further defines a lock opening 82 to provide front access to the locking device 46, and a set of button openings 84 to provide access to the set of buttons 44 from the front side of the panel 26. In particular, the cover 40 defines a set of internally projecting recesses 86 and a set of externally projecting rims or protrusions 88 enabling the cover 40 to extend around the set of buttons 44.

The projection rims 88 allow a user to easily grasp the panel 26 while removing the panel 26 from the frame 22. That is, when a user depresses the set of buttons 44 to unlatch the panel 26 from the frame 22, the set of projecting rims 88 provides a gripping surface for the user's fingers thus enabling the user to immediately hold the panel 26 so that panel 26 does not fall away from the electronic cabinet frame 22 and out of the user's grasp (e.g., so that the panel 26 does not fall out of the users hands and onto the floor resulting in damage). It should be understood that the panel 26 and its components (e.g., the set of buttons 44 and the set of latches 42) are arranged so that the user pushes the buttons 44 toward each other and toward the locking device 46. Such operation provides ergonomic advantages such as being well-suited for actuation by a user's pair of hands while the user stands in front of the electronic cabinet 20. In particular, the user can depress the set of buttons 44 and grasp the panel 26 in a contiguous manner without exerting significant effort and without any awkwardness (e.g., without having to stand in an awkward position or move in an awkward manner). Further details of how the panel 26 operates will now be provided with reference back to FIGS. 1 through 4.

Regardless of whether the locking device 46 is in the unlocked state or the locked state, the user is capable of installing the panel 26 onto the electronic cabinet frame 22. In particular, the user pushes the panel 26 toward the frame 22 such that the latches 42 of the panel 26 engage with the fasteners 24 which are attached to the vertically-oriented frame members 30 (see arrow 34 of FIG. 1). The latches 42 are configured to move toward each other and toward the locking device 46 due to interference from the fasteners 24, i.e., toward a center region 90 of the panel 26 within which the locking device 46 resides. Once the latches 42 move past catch portions of the fasteners 24, the springs 58, which constantly bias the latches 42 toward the edges of the panel cover 40, pushes the latches 42 into engagement with the fasteners 24. At this point, the panel 26 is reliably fastened to the frame 22. It should be understood that the latches 42 freely move along the axis 70 (FIG. 3) regardless of the state of the locking device 46 so that no damage occurs to the latches 42 even if the user installs the panel 26 while the locking device 46 is in the locked state.

When the locking device 46 is in the unlocked state, the user is capable of removing the panel 26 from the frame 22. In particular, the user depresses the set of buttons 44 toward each other and toward the locking device 46. As each button 44 depresses, that button 44 pushes against the latch 42 corresponding to that button 44 thus moving the latch 42 toward the locking device 46 and compressing the spring 58. At this point, the latches 42 are no longer in engagement with the fasteners 24 and the user is free to move the panel 26 away from the frame 22. For example, the user continues to push the buttons 44 toward each other and grips the panel cover 40 by the projecting rims 88 in order to hold and carry the panel 26 as it disengages from the frame 22.

In contrast, when the locking device 46 is in the locked state, the user is prevented from removing the panel 26 from the frame 22. In particular, the locking device 46 provides interference to the buttons 44 thus preventing the buttons 44 from depressing and moving the latches 42. Accordingly, the latches 42 maintain engagement with the fasteners 24 thus continuing to reliably hold the panel 26 to the frame 22. The retention of the panel 26 against the frame 22 provides more security than a conventional panel which simply requires a user to push protruding sides toward each other to remove the conventional panel.

It should be understood that, in one arrangement, the button 44 includes a face having a set of friction bumps 92 (e.g., four dimples). The bumps 92 on the button face provide the user's fingers with a textured gripping surface making it less likely that the 40-C of the cover and a clear view of the set of friction bumps 92 of one of the buttons 44.

It should be further understood that, as explained earlier, the locking device 46 does not control movement of the set of latches 42. Rather, the set of latches 42 is always permitted to move laterally along the axis 70 (FIG. 3). That is, the set of latches 42 is movable regardless of whether the locking device 46 is in a locked state or an unlocked state. Accordingly, the latch 42 will not jam and/or break if the panel 26 is installed onto the frame 22 while the locking device 46 is in the locked state.

Recall that the hardware 50 is configured to provide biasing force on the set of latches 42. In particular, the hardware pushes the latches 42 away from the cover tab 51 and outwardly toward the side of the panel cover 40. However, if enough force is applied against the latch end 64 to overcome the spring force, the latch end 64 moves inwardly toward the center region 90 of the cover 40 regardless of the state of the locking device 46. Accordingly, a user can push the cover 40 toward the electronic cabinet frame 22, and the set of latches 42 will respond by initially deflecting inwardly and then outwardly after passing catch portions of the fasteners 24 to engage the fasteners 24 and secure the panel 26 to the electronic cabinet frame 22 regardless of the state of the locking device 46. For example, if the user attempts to attach the panel 26 while the locking device 46 is in the locked state, no damage will occur to the latches 42 since the latches 42 are free to move along the axis 70 (i.e., to deflect and engage the fasteners 24) regardless of the state of the locking device 46 (see FIG. 3).

Furthermore, when the panel 26 is installed onto the electronic cabinet frame 22, the user is capable of depressing the set of buttons 44 and thus actuating the set of latches 42 to unlatch the panel 26 from the electronic cabinet frame 22 only when the locking device 46 is in the unlocked state. If the locking device 46 is in the locked state, the user is unable to depress the set of buttons 44 and thus unable to remove the panel 26 from the electronic cabinet frame 22. Further details of the invention will now be provided with reference to FIGS. 5 and 6.

Figure 5:
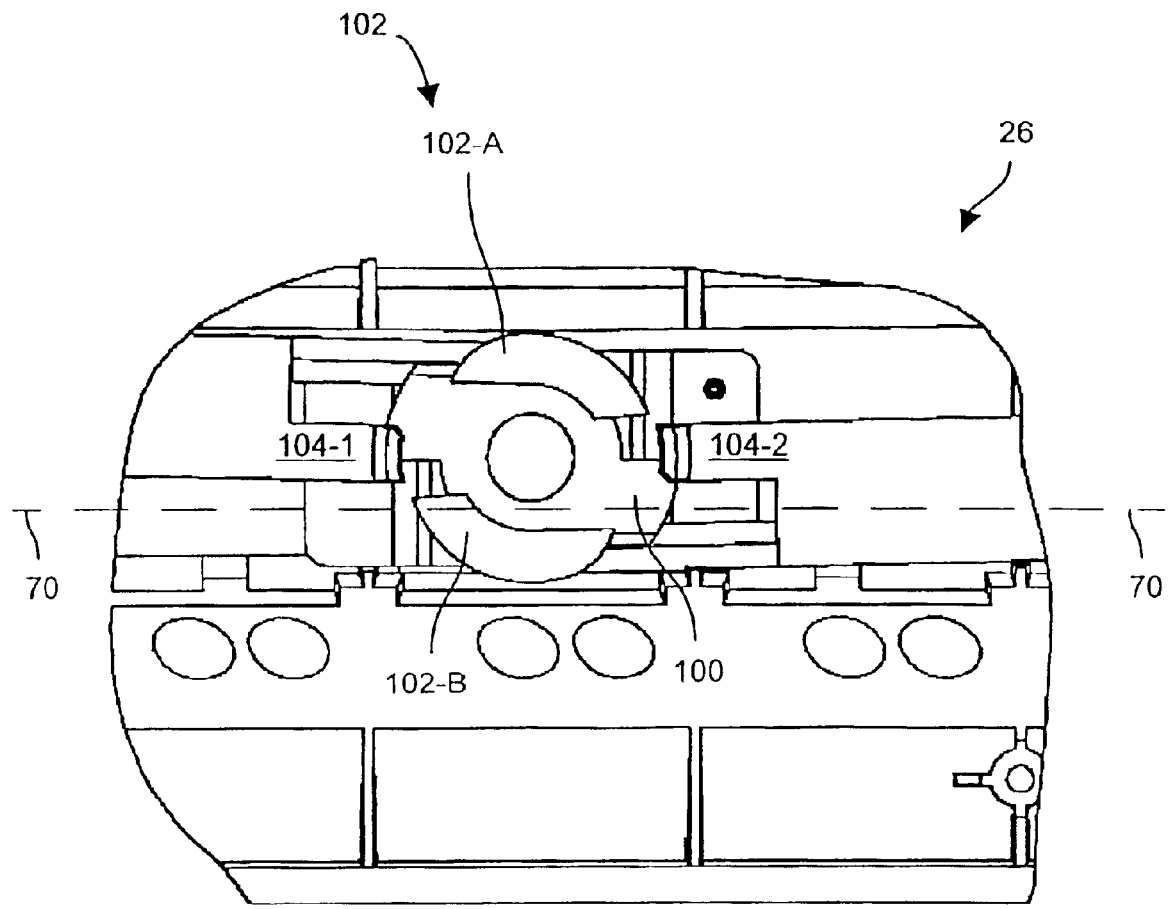
FIG. 5 is a detailed view of a locking device of the panel of FIGS. 2 through 4A, when the locking device is in an unlocked state.

FIG. 5 shows a close-up view of the locking device 46 on the back side of the panel 26 when the locking device 46 is in the unlocked state. As shown, the locking device 46 includes a locking wheel (or pawl) 100 which is configured to rotate in response to actuation by turning action from a key inserted into the locking device 46 (also see FIG. 4). As shown in FIG. 5, the locking wheel 100 includes a set of interference members 102-1, 102-2 (collectively, interference members 102) which selectively move against ends 104-1, 104-2 defined by elongated actuating portions 106-1, 106-2 of the set of buttons 44 (collectively, button ends 104) or away from the button ends 104 depending on the orientation of the locking wheel 100. That is, when 110 the locking device 46 is in the unlocked state as shown in FIG. 5, the set of interference members 102 is disposed away from the ends of the set of buttons 44 thus enabling a user to depress the set of buttons 44. When the user depresses the set of buttons 44, and the set of buttons 44 moves the set of latches 42 along the axis 70 inwardly and toward the locking device 46 without interference. As a result, the latch tabs 64 (FIG. 2) of the latches 42 move toward the center of the panel 26 and out of engagement of the fasteners 24. Thus, the panel 26 releases from the electronic cabinet frame 22.

Figure 6:
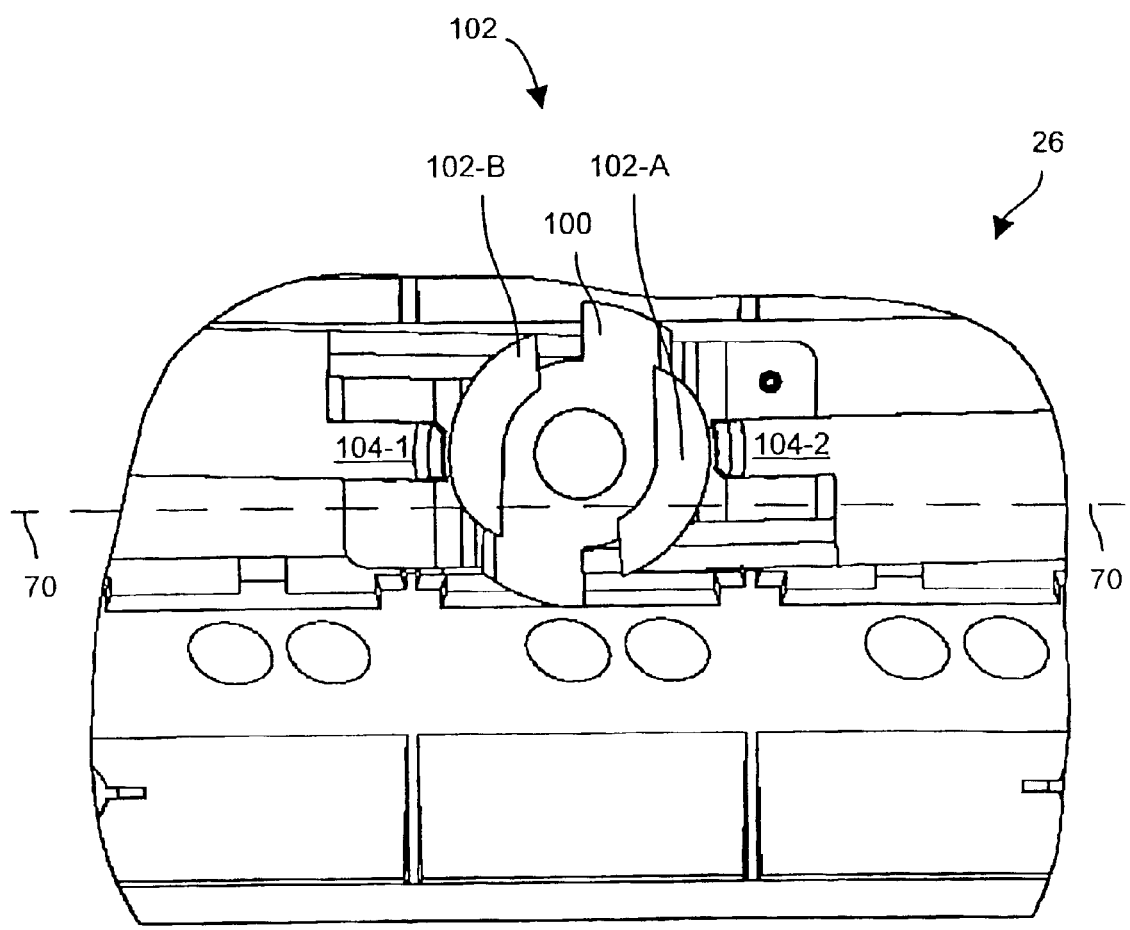
FIG. 6 is a detailed view of the locking device FIG. 5, when the locking device is in a locked state.

FIG. 6 shows a close-up view of the locking device 46 on the back side of the panel 26 when the locking device 46 is in the locked state. Here, the user has inserted the key into the locking device 46 through the hole 82 on the front side of the panel 26 (FIG. 4), and turned the key so that the locking device 46 is now locked. As shown in FIG. 6, the set of interference members 102 of the locking wheel 100 is against the ends 104 of the set of buttons 44 thus preventing the user from depressing the set of buttons 44. In particular, if a user attempts to depress the set of buttons 44, the ends 104 will push against the set of interference members 102 thus preventing the set of buttons 44 from moving inwardly and along the axis 70. As a result, the latch ends 64 (FIG. 2) of the latches 42 will not move toward the center of the panel 26 to disengage from the fasteners 24. Thus, the panel 26 will remain fastened to the electronic cabinet frame 22.

Figure 7:
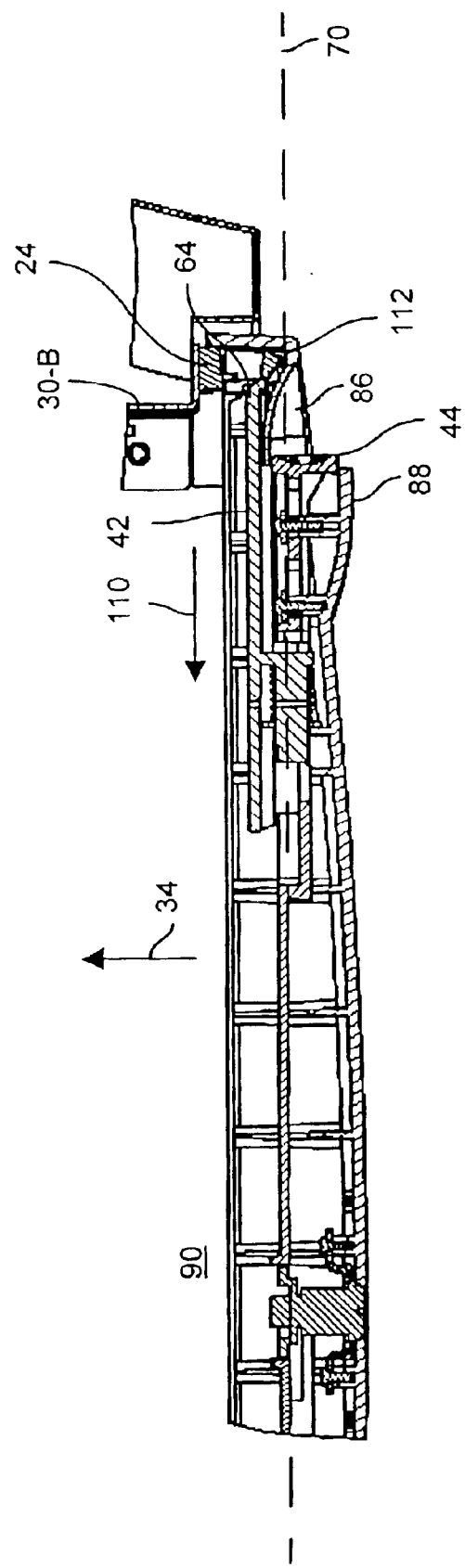
FIG. 7 is a cross-sectional top view of the portion of the panel of FIGS. 2 through 4A when the panel is installed onto a side of an electronic cabinet frame of the electronic cabinet of FIG. 1.

FIG. 7 is a cross-sectional top view of a portion of the panel 26 as the panel 26 is being installed onto a side of the electronic cabinet frame 22 by a user. In particular, the user is pushing the panel 26 in the direction 34. As shown, the latching end 64, which is always capable of moving along the axis 70 regardless of the state of the locking device 46, has been deflected toward the center region 90 of the cover 40 (see the arrow 110) due to interference from a catch portion 112 of a fastener 24 which is attached to a vertical frame member 30-B (also see FIG. 1). Once the latching end 64 passes the catch portion 112, the hardware 50 (i.e., the spring 58) pushes the latch 42 in the opposite direction (i.e., the direction opposite the arrow 110) thus engaging the latching end 64 with the fastener 24 and thus attaching the panel 26 to the frame 22. Further details of the invention will now be provided with reference to FIG. 8.

Figure 8:
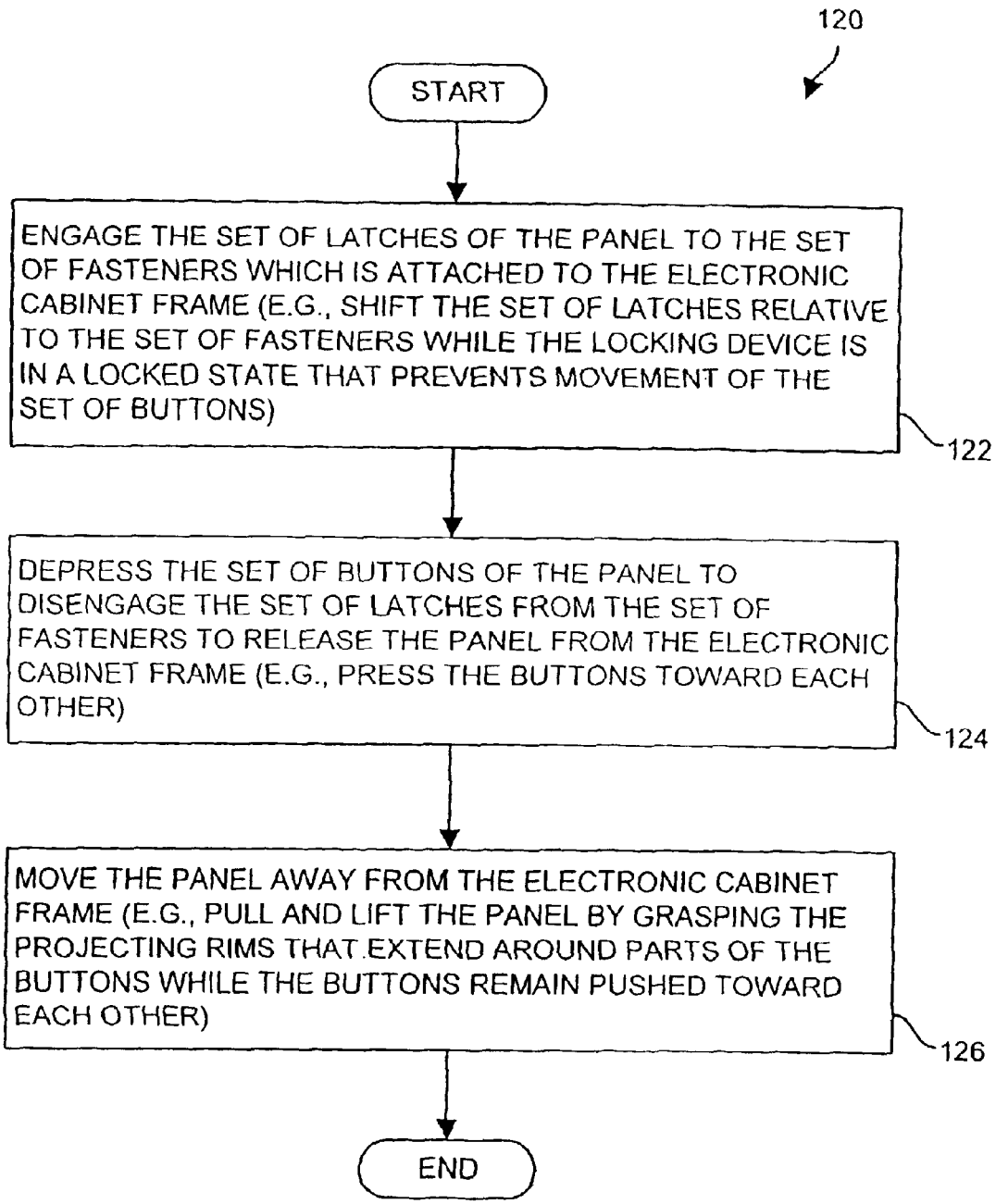
FIG. 8 is a flowchart of a procedure for operating the panel of FIGS. 2 through 4A.

FIG. 8 is a flowchart of a procedure 120 which is performed by a user when operating the panel 26. In step 122, the user engages the set of latches 42 to the electronic cabinet frame 22. In particular, the user pushes the panel 26 toward the fame 22 in the direction 34 (also see FIG. 1) until the latches 42 latch onto the fasteners 24 to hold the panel 26 to the frame 22. It should be understood that the user is capable of performing step 122 even when the locking device 46 is in the locked state that prevents movement of the set of buttons 44. The panel 26 is now installed onto the frame 22 and provides protection to equipment housed therein.

In step 124, the user depresses the set of buttons 44 to actuate the set of latches 42. If the locking device 46 in initially in the locked state, the user must unlock the locking device 46 prior to depressing the buttons 44. When the users pushes the buttons 44, the buttons 44 move the latches 42 such that the latch ends 64 no longer latch onto the fasteners 24 (also see FIGS. 1 and 7).

In step 126, the user moves the panel 26 away from the electronic cabinet frame 22. In particular, the user pulls and lifts the panel 26 by grasping the panel 26 by the projecting rims 88 of the panel cover 46 while the user continues to depress the buttons 44. In this manner, the user removes the panel 26 completely from the frame 22. Accordingly, the user now has complete access to the equipment within the electronic cabinet 20. The user was able to remove the panel 26 cleanly without any awkwardness. In particular, unlike conventional lockable hinged panels which require a user to undo a hinge and potentially handle loose parts, the user removing the panel 26 from the frame 22 simply depresses the buttons 44 while gripping the panel cover 40 by the projecting rims 88 and without undoing any hinge or handling loose parts.

As described above, the invention is directed to panel attachment and detachment techniques which use a panel 26 having a set of latches 42 and a set of buttons 44. When the set of latches 42 attaches the panel 26 to a frame 22 (e.g., an equipment rack), a user is capable of actuating the set of latches 42 to disengage the panel 26 from the frame 22 by depressing the set of buttons 44 (e.g., by pushing a first button and a second button disposed in a front face of the panel toward each other). Such operation enables a user to fully remove the panel 26 from the frame 22 without having to disconnect a hinge as in the above-described conventional hinged panel. Furthermore, such a configuration is well-suited for employing a locking device 46 that selectively enables or disables depression of the set of buttons 44 to provide more secure equipment access.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic cabinet, comprising:
   a set of vertically-oriented frame members;
   a set of fasteners attached to the set of vertically-oriented frame members; and
   a panel having (i) a cover, (ii) a set of latches coupled to the cover, and (iii) a set of buttons which, when the set of latches engages the set of fasteners to secure the panel to the set of vertically-oriented frame members and when the set of buttons is depressed, is configured to disengage the set of latches from the set of fasteners to release the panel from the set of vertically-oriented frame members, and a locking device coupled to the cover, the locking device being configured to selectively enable and disable movement of the set of buttons.

2. The electronic cabinet of claim 1 wherein each button of the panel is configured to move in a sliding manner relative to the cover of the panel.

3. The electronic cabinet of claim 2 wherein the cover of the panel is wider than a distance between the vertically-oriented frame members, and wherein each button is configured to depress in a direction away from an adjacent end of the cover.

4. The electronic cabinet of claim 1 wherein each button is configured to slide within a respective channel defined by the cover of the panel.

5. The electronic cabinet of claim 1 wherein the panel further includes:
   an electromagnetic interference gasket coupled to the cover to provide a force on the panel in a direction away from the electronic cabinet frame when the panel is secured to the electronic cabinet frame.

6. A panel for an electronic cabinet frame, the electronic cabinet frame having (i) a set of vertically-oriented frame members and (ii) a set of fasteners attached to the set of vertically-oriented frame members, the panel comprising:
   a cover;
   a set of latches coupled to the cover,
   a set of buttons which, when the set of latches engages the set of fasteners to secure the panel to the electronic cabinet frame and when the set of buttons is depressed, is configured to disengage the set of latches from the set of fasteners to release the panel from the electronic cabinet frame; and
   a locking device coupled to the cover, the locking device being configured to selectively enable and disable movement of the set of buttons.

7. The panel of claim 6 wherein the set of buttons includes:
   a first button; and
   a second button; and wherein the first and second buttons are configured to depress toward each other when disengaging the set of latches from the set of fasteners.

8. The panel of claim 7 wherein the first and second buttons are disposed along an axis that runs substantially perpendicular to the set of vertically-oriented frame members when the panel is secured to the electronic cabinet frame.

9. The panel of claim 6 wherein the cover includes:
   a central portion;
   a top portion;
   a bottom portion;
   a first side portion; and
   a second side portion; wherein the top portion, the bottom portion, the first side portion and the second side portion (i) are disposed around a periphery of the central portion and (ii) extend from the central portion in a substantially perpendicular manner; and wherein the set of buttons are coupled to the central portion.

10. The panel of claim 9 wherein, when the panel is secured to the electronic cabinet frame, (i) each of the first and second side portions of the cover is adjacent to and substantially parallel to a respective one of the set of vertically-oriented frame members, and (ii) the top and bottom portions are substantially perpendicular to the set of vertically-oriented frame members.

11. The panel of claim 9 wherein the central portion of the cover defines, for each button of the set of buttons, an externally projecting rim that extends around at least part of that button.

12. The panel of claim 9 wherein the central portion of the cover defines, for each button of the set of buttons, a depression adjacent that button.

13. The panel of claim 6 wherein the set of buttons includes:
   a first button; and
   a second button; wherein the first and second buttons are configured to depress (i) toward each other and (ii) toward the locking device when disengaging the set of latches from the set of fasteners; and wherein the locking device is disposed between the first and second buttons.

14. The panel of claim 6 wherein each button of the set of buttons includes:
   a face portion which is configured to contact a user's finger; and
   an elongated actuation portion having an end disposed adjacent to the locking device.

15. The panel of claim 14 wherein the elongate actuation portion of each button is configured to affix to a respective latch of the set of latches.

16. The panel of claim 6 further comprising:
   a set of springs that biases the set of latches and the set of buttons toward a set of outer edges of the cover.

17. The panel of claim 6 wherein the cover defines a set of channels, a respective latch of the set of latches and a respective channel of the set of channels being configured to reside within each channel of the set of channels.

18. The panel of claim 6 wherein each button is configured to move in a sliding manner relative to the cover.

19. The panel of claim 18 wherein the cover is configured to be wider than a distance between the vertically-oriented frame members of the electronic cabinet frame, and wherein each button is configured to depress in a direction away from an adjacent end of the cover.

20. The panel of claim 6 wherein each button is configured to slide within a respective channel defined by the cover.

21. The panel of claim 6, further comprising:
an electromagnetic interference gasket coupled to the cover to provide a force on the panel in a direction away from the electronic cabinet frame when the panel is secured to the electronic cabinet frame.

22. A panel for an electronic cabinet frame, the electronic cabinet frame having (i) a set of vertically-oriented frame members and (ii) a set of fasteners attached to the set of vertically-oriented frame members, the panel comprising:
a cover;
a set of latches coupled to the cover;
a set of buttons which, when the set of latches engages the set of fasteners to secure the panel to the electronic cabinet frame and when the set of buttons is depressed, is configured to disengage the set of latches from the set of fasteners to release the panel from the electronic cabinet frame, wherein each button of the set of buttons includes:
an actuating portion in communication with a corresponding latch of the set of latches; and
a face portion that defines a set of friction bumps to contact a user's finger.

23. A panel for an electronic cabinet frame, the electronic cabinet frame having (i) a set of vertically-oriented frame members and (ii) a set of fasteners attached to the set of vertically-oriented frame members, the panel comprising:
a cover;
a set of latches coupled to the cover;
a set of buttons which, when the set of latches engages the set of fasteners to secure the panel to the electronic cabinet frame and when the set of buttons is depressed, is configured to disengage the set of latches from the set of fasteners to release the panel from the electronic cabinet frame;
a set of springs that biases the set of latches and the set of buttons toward a set of outer edges of the cover: and
an electromagnetic interference gasket coupled to the cover to provide a force on the panel in a direction away from the electronic cabinet frame when the panel is secured to the electronic cabinet frame.

24. A method for operating a panel for an electronic cabinet frame, the electronic cabinet frame having (i) a set of vertically-oriented frame members and (ii) a set of fasteners attached to the set of vertically-oriented frame members, the method comprising the steps of:

engaging a set of latches of the panel to the set of fasteners of the electronic cabinet frame to secure the panel to the electronic cabinet frame;
actuating a locking device of the panel, the locking device being configured to selectively enable and disable movement of a set of buttons of the panel;
depressing the set of buttons of the panel to disengage the set of latches from the set of fasteners to release the panel from the electronic cabinet frame; and
after the step of depressing, moving the panel away from the electronic cabinet frame.

25. The method of claim 24 wherein the set of buttons includes a first button and a second button, and wherein the step of depressing the set of buttons includes the step of:
pushing the first and second buttons toward each other.

26. The method of claim 25 wherein the step of moving the panel away from the electronic cabinet frame includes the step of:
pulling and lifting the panel by grasping projecting rims that extend around parts of the first and second buttons while the first and second buttons remain pushed toward each other.

27. The method of claim 24 wherein the panel further includes a locking device, and wherein the step of engaging the set of latches of the panel to the set of fasteners of the electronic cabinet frame includes the step of:
shifting the set of latches relative to the set of fasteners to secure the panel to the electronic cabinet frame while the locking device is in a locked state that prevents movement of the set of buttons.

28. The method of claim 25 wherein the step of depressing the set of buttons includes the step of:
applying respective forces directly onto a surface of each button to move that button in a sliding manner relative to the cover.

29. The method of claim 28 wherein the panel has a cover which is configured to be wider than a distance between the vertically-oriented frame members of the electronic cabinet frame, and wherein applying the respective forces includes the step of:
pushing each button in a direction away from an adjacent end of the cover.

30. The method of claim 24 wherein the panel has a cover, and wherein the step of depressing the set of buttons includes the step of:
sliding each button within a respective channel defined by the cover.

* * * * *